(12) United States Patent
Liang

(10) Patent No.: US 10,930,546 B2
(45) Date of Patent: Feb. 23, 2021

(54) TFT SUBSTRATE AND METHOD FOR MANUFACTURING THE SAME

(71) Applicant: Wuhan China Star Optoelectronics Semiconductor Display Technology Co., Ltd., Wuhan (CN)

(72) Inventor: Bo Liang, Shenzhen (CN)

(73) Assignees: Wuhan China Star Optoelectronics Semiconductor, Wuhan (CN); Display Technology Co., LTD., Wuhan (CN)

( * ) Notice: Subject to any disclaimer, the term of this patent is extended or adjusted under 35 U.S.C. 154(b) by 229 days.

(21) Appl. No.: 15/740,286

(22) PCT Filed: Nov. 23, 2017

(86) PCT No.: PCT/CN2017/112507
§ 371 (c)(1),
(2) Date: Dec. 27, 2017

(87) PCT Pub. No.: WO2019/075841
PCT Pub. Date: Apr. 25, 2019

(65) Prior Publication Data
US 2019/0385900 A1     Dec. 19, 2019

(30) Foreign Application Priority Data
Oct. 17, 2017  (CN) .......................... 201710976235.8

(51) Int. Cl.
*H01L 21/762*   (2006.01)
*H01L 27/12*    (2006.01)

(52) U.S. Cl.
CPC ...... *H01L 21/76251* (2013.01); *H01L 27/127* (2013.01); *H01L 27/1262* (2013.01); *H01L 27/1288* (2013.01); *H01L 27/1218* (2013.01)

(58) Field of Classification Search
CPC .................................................... H01L 21/762
See application file for complete search history.

(56) References Cited

FOREIGN PATENT DOCUMENTS

| CN | 102969320 A | 3/2013 |
|---|---|---|
| CN | 105355634 A | 2/2016 |
| CN | 105679800 A | 6/2016 |
| CN | 106158582 A | 11/2016 |

*Primary Examiner* — Marvin Payen
(74) *Attorney, Agent, or Firm* — Brinks Giison & Lions

(57) ABSTRACT

The present disclosure provides a TFT substrate and a method for manufacturing the same. The method includes: providing a silicon-wafer plate; forming first masking structures on the silicon-wafer plate and etching to form island structures; cutting the island structures layer by layer to form a silicon-wafer sub-plate; and attaching the silicon-wafer sub-plate on a substrate to form the TFT substrate. The implementation of the present disclosure may form the island structures on the substrate to improve the stability of the substrate during bending.

17 Claims, 5 Drawing Sheets

… (1)

TFT SUBSTRATE AND METHOD FOR MANUFACTURING THE SAME

CROSS-REFERENCE TO RELATED APPLICATIONS

The present application is a 35 U.S.C. § 371 National Phase conversion of International (PCT) Patent Application No. PCT/CN2017/112507, filed on Nov. 23, 2017, which claims foreign priority of Chinese Patent Application No. 201710976235.8, filed on Oct. 17, 2017 in the State Intellectual Property Office of China, the entire contents of which are hereby incorporated by reference.

TECHNICAL FIELD

The present disclosure generally relates to the display panel manufacturing field, and in particular to a TFT substrate and a method for manufacturing the same.

BACKGROUND

The flexible display panel is a deformable and bendable display apparatus. The flexible display panel may be applied into the electronic paper, LCD, OLED etc. An OLED (organic light-emitting diode) flexible display panel has the advantages, such as, low consumption, thin thickness and rollable ability, thus it largely attracts the peoples' eyes.

The OLED flexible display panel may include a flexible substrate, OLED display components and connecting lines for connecting the OLED display components. The OLED display components may include an anode electrode, a cathode electrode opposite to the anode electrode and a functional layer between the anode electrode and the cathode electrode. The OLED display panel is lighted by means of the semiconductor material and the organic light-emitting material being driven by the electric field between the anode electrode and the cathode electrode, to inject or recombine the carries.

A polyimide (PI) flexible substrate is a type of flexible substrate with good bendability and temperature resistance. Therefore it is widely used as the substrate of the OLED flexible display panel. In order to reduce the stress mismatch between the flexible substrate and TFT (thin film transistor) component films and to improve the stability during bending, the flexible substrate may be designed to have island structures. However, it is difficult to form the island structures on a polyimide flexible substrate.

SUMMARY

Accordingly, the present disclosure aims to provide a TFT substrate and a method for manufacturing the same to form the island structures on a substrate so as to improve the stability of the substrate during bending.

To solve the above mentioned problem, a technical scheme adopted by the present disclosure is to provide a method for manufacturing a TFT substrate. The method comprises: providing a silicon-wafer plate; coating the silicon-wafer plate with a layer of photoresist material; patterning the photoresist material and removing a portion of the photoresist material where first masking structures are to be set; forming a first masking layer on a side of the silicon-wafer plate which is coated with the photoresist material, wherein the first masking layer covers the photoresist material; removing a portion of the first masking layer which covers the photoresist material with an etching solution corresponding to the photoresist material so as to forming the first mask; plasma etching the silicon-wafer plate to form island structures; cutting the island structures layer by layer to form a silicon-wafer sub-plate; and attaching the silicon-wafer sub-plate onto a substrate to form the TFT substrate.

To solve the above mentioned problem, another technical scheme adopted by the present disclosure is to provide a method for manufacturing a TFT substrate. The method comprises: providing a silicon-wafer plate; forming first masking structures on the silicon-wafer plate and etching to form island structures; cutting the island structures layer by layer to form a silicon-wafer sub-plate; and attaching the silicon-wafer sub-plate on a substrate to form the TFT substrate.

To solve the above mentioned problem, another technical scheme adopted by the present disclosure is to provide a TFT substrate. The TFT substrate is manufactured by the above-mentioned method. The method comprises: providing a silicon-wafer plate; forming first masking structures on the silicon-wafer plate and etching to form island structures; cutting the island structures layer by layer to form a silicon-wafer sub-plate; and attaching the silicon-wafer sub-plate on a substrate to form the TFT substrate.

The method of the present disclosure may include forming first masking structures on a silicon-wafer substrate, etching to form island structures, cutting layer by layer the island structures and then attaching onto a substrate to form a TFT substrate. Therefore, the implementation of the present disclosure may improve the stability of the substrate during bending and reduce the stress mismatch between the substrate and a TFT component film.

DETAILED DESCRIPTION

The disclosure will now be described in detail with reference to the accompanying drawings and examples.

To solve the above mentioned problem, a technical scheme adopted by the present disclosure is to provide a method for manufacturing a TFT substrate. The method comprises: providing a silicon-wafer plate; forming first masking structures on the silicon-wafer plate and plasma etching to form island structures; cutting the island structures layer by layer to form a silicon-wafer sub-plate; attaching the silicon-wafer sub-plate on a substrate to form the TFT substrate. The method will be depicted in detail as follows.

Figure 1:
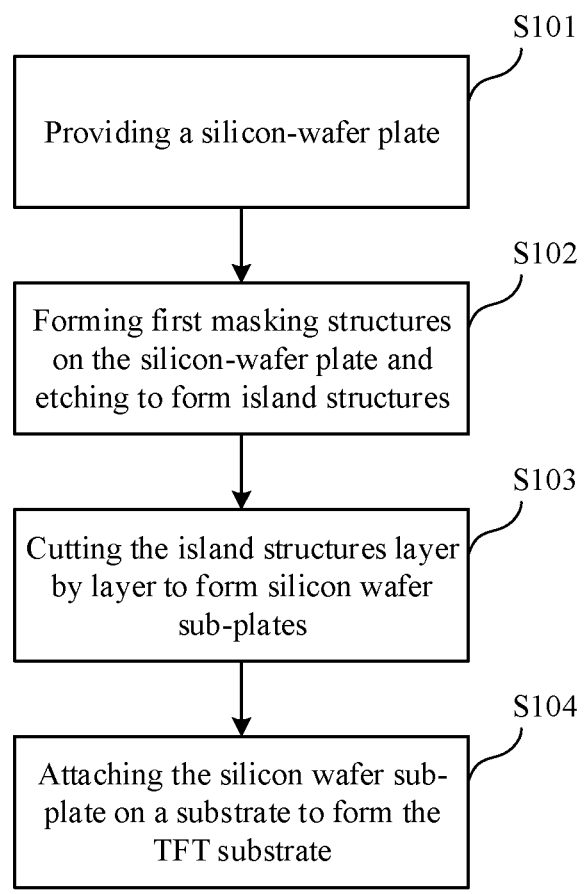
FIG. 1 is a flow chart of the method for manufacturing a TFT substrate according to an embodiment of the present disclosure.

Referring to FIG. 1, FIG. 1 is a flow chart of the method for manufacturing a TFT substrate according to an embodiment of the present disclosure.

S101: Providing a silicon-wafer plate.

In this embodiment, in order to implement island elements on a flexible substrate, a silicon-wafer plate may be taken as material to prepare the island structures to be attached on the flexible substrate. Those skilled in the art should understand, materials having similar molecular structure as the silicon-wafer which may match the flexible substrate, such as the chemical elements in the same family of silicon, may also be utilized to prepare the island elements.

S102: Forming first masking structures on the silicon-wafer plate and etching to form island structures.

In this embodiment, a metal layer may be deposited as first masking structures on the silicon-wafer plate. Then the island structures may be formed by etching the silicon-wafer plate. The metal layer may be a layer of nickel.

S103: Cutting the island structures layer by layer to form silicon-wafer sub-plates.

In this embodiment, after the island structures are formed by etching the silicon-wafer plate, the island structures on the silicon-wafer plate may be cut layer by layer according to the structure and size of the island structures to be formed on the TFT substrate, so as to obtain silicon-wafer sub-plates as the island structures on the substrate.

S104: Attaching the silicon-wafer sub-plate onto the substrate to form the TFT substrate.

In this embodiment, the substrate may be a polyimide (PI) flexible substrate. The polyimide flexible substrate itself has a certain adhesive capacity. Accordingly, one of the silicon-wafer sub-plates may be attached onto the polyimide flexible substrate with the help of the adhesive capacity of the polyimide flexible substrate. In subsequent processes, the silicon-wafer sub-plate may be taken as the island structures matching TFT components in order to manufacture the TFT substrate.

The present disclosure provides a method including forming first masking structures on a silicon-wafer substrate, etching the silicon-wafer substrate via the first masking structures to form island structures, cutting layer by layer the island structures and then attaching the silicon-wafer sub-plate onto a substrate to form the TFT substrate. Therefore, the implementation of the present disclosure may improve the stability of the substrate during bending and reduce the stress mismatch between the substrate and a TFT component film.

Figure 2:
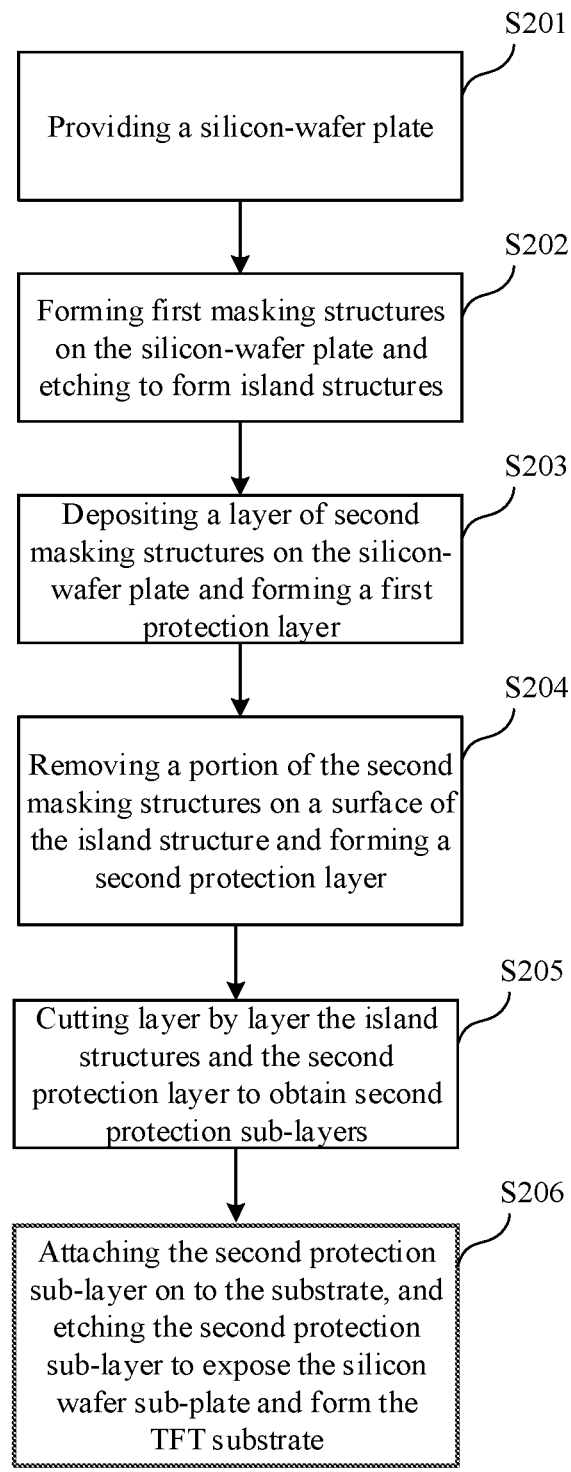
FIG. 2 is a flow chart of the method for manufacturing a TFT substrate according to another embodiment of the present disclosure.

Referring to FIG. 2, FIG. 2 is a flow chart of the method for manufacturing a TFT substrate according to another embodiment of the present disclosure.

S201: Providing a silicon-wafer plate.

In this embodiment, in order to implement island structures on a flexible substrate, a silicon-wafer plate may be taken as material to prepare the island structures attached on the flexible substrate. Those skilled in the art should understand, materials having similar molecular structure as the silicon-wafer which may match the flexible substrate, such as the chemical elements in the same family of silicon, may also be utilized to prepare the island structure.

S202: forming first masking structures on the silicon-wafer plate and etching to form island structures.

Figure 3:
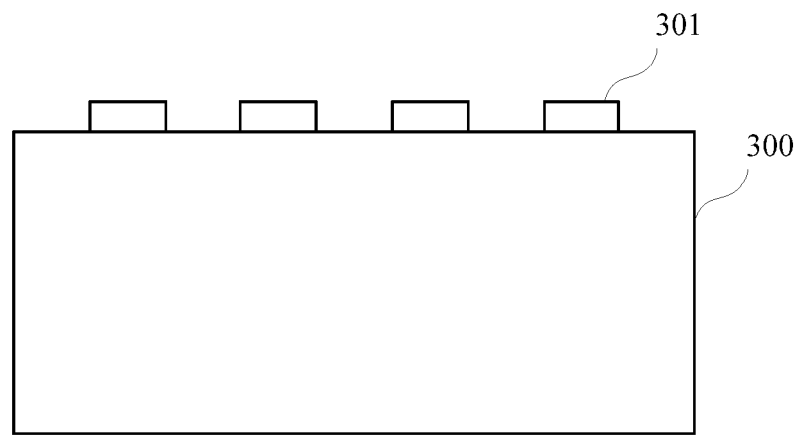
FIG. 3 shows a diagram of the first masking structures according to an embodiment of the present disclosure.
Figure 4:
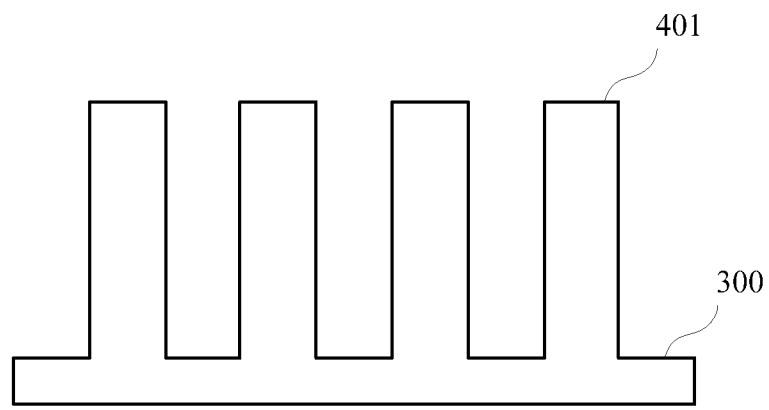
FIG. 4 shows a diagram of the island structures according to an embodiment of the present disclosure.

Referring to FIG. 3-4, in this embodiment, the silicon-wafer plate 300 may be coated with a layer of photoresist material. The photoresist material may be patterned by removing a portion of the photoresist material where the first masking structures 301 are to be set and keeping the remained photoresist material. Then a first masking layer may be formed on a side of the silicon-wafer plate 300 which is coated with the photoresist material, wherein the first masking layer may cover the surface of the silicon-wafer plate and the photoresist material thereon. A portion of the first masking layer which covers the photoresist material may be removed with etching solution corresponding to the photoresist material while the left of the first masking layer which does not cover the photoresist material is kept. Thus the first masking structures 301 may be formed. By further plasma etching the silicon-wafer plate 300 and the first masking structures 301, island structures 401 may be formed.

In one embodiment, the photoresist material coating the silicon-wafer plate 300 may be positive photoresist. A portion of the photoresist material on the silicon-wafer plate 300 where the first masking structures are to be set may be exposed to light. After applying developer, the photoresist material on the silicon-wafer plate 300 where the first masking structures 301 are to be set may be removed because the positive photoresist exposed to light will become liquid and washable by the etching solution. Apparently, the photoresist material coating the silicon-wafer plate 300 may alternatively be negative photoresist. All of the photoresist material on the silicon-wafer plate 300 except for the portion where the first masking structures 301 are to be set may be exposed to light. After applying developer, the photoresist material on the silicon-wafer plate 300 where the first masking structures 301 are to be set may be removed because only the negative photoresist exposed to light will become solid. In this embodiment, if the photoresist material is negative photoresist, a portion of the photoresist material on the silicon-wafer plate 300 where the first masking structures 301 are to be set may not be exposed to light while the left is exposed to light and hardened. Thus, the photoresist material on the silicon-wafer plate 300 where the first masking structures 301 are to be set may be washed away by etching solution.

In one embodiment, the exposure time of the photoresist material on the surface of the silicon-wafer plate 300 may be determined according to the height of the pattern to be formed. It should be noted that the exposure time should be long enough for removing the photoresist material on the surface of the silicon-wafer plate 300 at the location where the first masking structures 301 are to be set.

In one embodiment, a plasma beam may be shot towards the surface of the silicon-wafer plate 300 and the first masking structures 301. The plasma hits the silicon-wafer plate 300 so that the required island structures 401 may be formed.

In one embodiment, the first masking structures 301 may include nickel or other metal. Apparently, those skilled in the art should understand that elements having similar chemical and physical characters as nickel, such as elements of the same family of nickel, may also be utilized as the first masking structures 301 of this embodiment.

In one embodiment, the thickness of the first masking structures 301 may be 100 nm. Apparently, those skilled in the art should understand that the thickness of the first masking structures 301 should be thick enough for the first masking structures 301 to function as the etching mask during plasma etching of the silicon-wafer plate 300.

S203: Depositing a layer of second masking structures on the silicon-wafer plate and forming a first protection layer.

Figure 5:
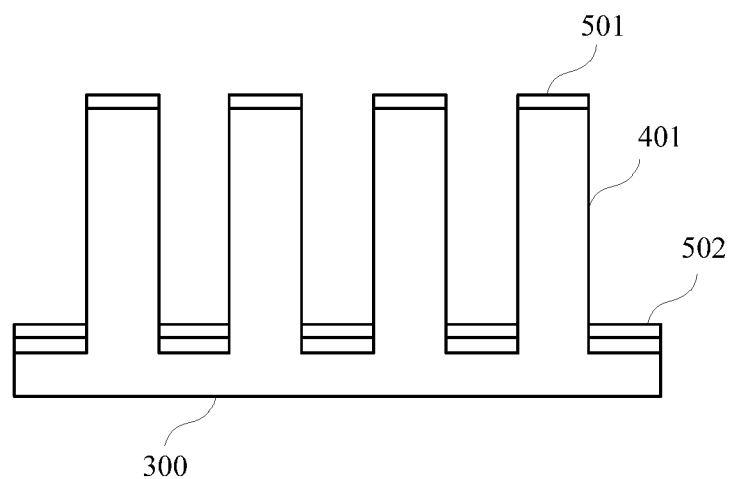
FIG. 5 shows a diagram of the layer of second masking structures and the first protection layer according to an embodiment of the present disclosure.

Referring to FIG. 5, in this embodiment, a layer of second masking structures 501 may be deposited on a surface of the silicon-wafer plate 300 where the island structures 401 have been formed. A first protection layer 502 may be formed and then hardened on a portion of the second masking structures 501 which is not located on the island structures of the silicon-wafer plate 300.

In one embodiment, in order to harden the first protection layer 502, the first protection layer 502 may be placed in a first temperature environment during a first predetermined time. By hardening the first protection layer 502 with a constant temperature, the adhesive force between the first protection layer 502 and the second masking structures 501 may be enhanced. The first temperature may be 180° C. and the first predetermined time may be 1 min. Those skilled in the art should understand that the first temperature and the first predetermined time may be determined according to the thickness and area of the first protection layer 502, and intend to make the first protection layer 502 to have enough stiffness and enough adhesive force with the second masking structures. The above-mentioned values are just illustrative and should not be taken as limit to the scope of the present disclosure.

In one embodiment, the first protection layer 502 may include polymethyl methacrylate (PMMA). The portion of the second masking structures 501 which is not located on the island structures 401 of the silicon-wafer plate 300 may be coated with 100 nm of PMMA which may help to attach the second masking structures 501 to the silicon-wafer plate 300. PMMA should be thick enough to provide enough adhesive force between the layer of second masking structures 501 and the silicon-wafer plate 300 and may be determined based on the size and thickness of the layer of second masking structures 501. Those skilled in the art should understand that the first protection 502 may also include other adhesive colloid, and the thickness of the colloid may be determined based on the adhesion between the silicon-wafer plate 300 and the layer of second masking structures 501, and the size and thickness of the layer of second masking structures 501.

In one embodiment, the second masking structures 501 may also be deposited on the surface of the island structures 401. The second masking structures 501 may be deposited on the surface of the silicon-wafer plate 300 by PVD (physical vapor deposition) such as vacuum plating, sputtering or ion plating.

In one embodiment, the layer of second masking structures 501 may be a metal layer of gold. The second masking structures 501 may be deposited on a portion of the silicon-wafer plate 300 where the island structures 401 are not formed so as to facilitate the separation of the bottom of the island structures 401 from the first protection layer 502. Apparently, those skilled in the art should understand that other metals which may facilitate the separation of the bottom of the island structures 401 from the first protection layer 502 may also be utilized to form the second masking structures 501.

In one embodiment, the thickness of the layer of second masking structures 501 may be 30 nm. Apparently, those skilled in the art may understand that the thickness of the layer of second masking structures 501 should be large enough for facilitating the separation of the bottom of the island structure 401 from the first protection layer 502.

S204: Removing the layer of second masking structures on the surface of the island structures and forming a second protection layer wrapping around the island structures.

Figure 6:
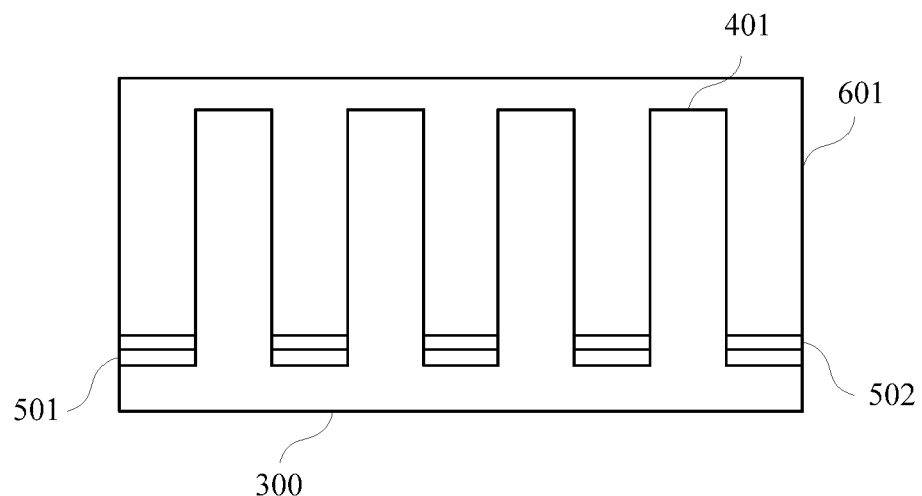
FIG. 6 shows a diagram of the second protection layer according to an embodiment of the present disclosure.

Referring to FIG. 6, in this embodiment, etching solution corresponding to the second masking structures 501 may be utilized to etch the second masking structures 501 on the surface of the island structures 401. The second masking structures 501 deposited on the portion of the silicon-wafer plate 300 where the island structures 401 are not formed may not be etched by the etching solution since it is covered by the first protection layer 502. Consequently, only the second masking structures 501 deposited on the surface of the island structures 401 far away from the first protection layer 502 will be etched. Then a second protection layer 601 wrapping around the island structure 401 may be formed and hardened on the silicon-wafer plate 300.

In one embodiment, in order to harden the second protection layer 601, the second protection layer 601 may be placed in a second temperature environment during a second predetermined time. By hardening the second protection layer 601 with a constant temperature, the adhesive force between the second protection layer 601 and the island structure 401 may be enhanced. The second temperature may be 80° C. and the second predetermined time may be 4 h. Those skilled in the art should understand that the second temperature and the second predetermined time may be determined according to the thickness and area of the second protection layer 601, and intend to make the second protection layer 601 to have enough stiffness and adhesive force with the island structures 401. The above-mentioned values are just illustrative and should not be taken as limit to the scope of the present disclosure.

S205: cutting layer by layer the island structures and the second protection layer to obtain second protection sub-layers.

Figure 7:
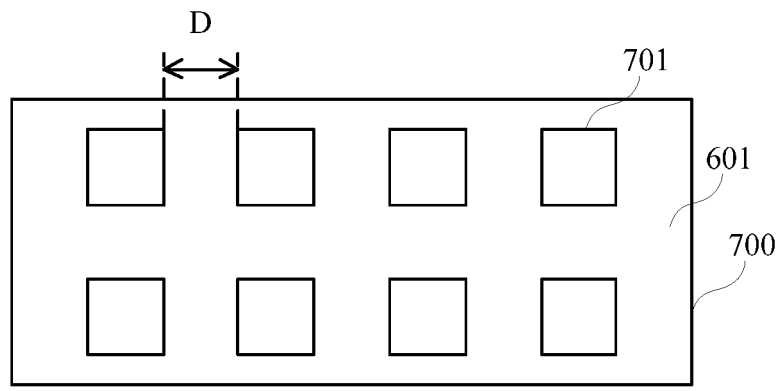
FIG. 7 shows a diagram of the second protection sub-layer according to an embodiment of the present disclosure.

Referring to FIG. 7, in this embodiment, second protection sub-layers 700 may be obtained by cutting layer by layer the island structures 401 and the second protection layer 601 wrapping around. The second protection sub-layers 700 wrap around a same number of silicon-wafer sub-plates as the island structures, which will be utilized in subsequent processes for manufacturing the TFT substrate.

In one embodiment, the second protection layer 601 may include an epoxy layer. The second protection layer 601 wrapping around the silicon-wafer sub-plates may be hardened to maintain the distance D of each two of the silicon-wafer sub-plates. Those skilled in the art should understand, the distance D may be determined according to the required distance between the island structures on the TFT substrate.

In one embodiment, the island structures 401 and the second protection layer 601 wrapping around may be cut along a cutting direction parallel to the extending direction of the silicon-wafer plate 300. Apparently, those skilled in the art should understand, the island structures 401 and the second protection layer 601 wrapping around may also be cut one by one so as to acquire the silicon-wafer sub-plates 701 for manufacturing the island elements on the TFT substrate. The thickness of the second protection layer 700 may be determined according to the required thickness of the island elements on the TFT substrate.

In one embodiment, a nanometer diamond cutter may be utilized to cut layer by layer the island structures 401 and the second protection layer 601 wrapping around so as to obtain the second protection sub-layer 700. Apparently, those skilled in the art should understand that other nano-sized cutting tools such as laser may also be utilized.

S206: Attaching the second protection sub-layer onto the substrate and etching the second protection sub-layer to expose the silicon-wafer sub-plates so as to acquire the TFT substrate.

Figure 8:
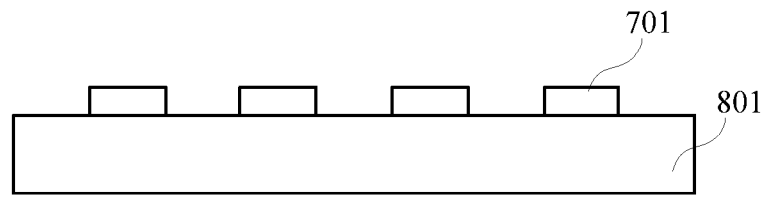
FIG. 8 shows a diagram of the substrate attached with a silicon-wafer sub-plate according to an embodiment of the present disclosure.

Referring to FIG. 8, in this embodiment, the substrate may be a polyimide (PI) flexible substrate. The polyimide flexible substrate itself has a certain adhesive capacity. It should be understood that any substrate having a certain adhesive capacity may also be utilized to manufacturing the TFT substrate 801 of the present disclosure.

The second protection sub-layer 700 obtained in the previous steps may be attached onto a substrate 801. The silicon-wafer sub-plates 701 may be exposed by plasma etching the second protection layer 700. After plasma etching, the second protection layer 601 on the substrate 801 may be removed, and the silicon-wafer sub-plates may be kept as the island elements of the TFT substrate. Then the substrate 801 may be placed in a third temperature environment during a third predetermined time so as to enhance the adhesive force between the silicon-wafer sub-plates 701 and the substrate 801. The silicon-wafer sub-plates 701 may be utilized as the island elements matching the TFT components for the sequent processes.

In one embodiment, the third temperature may be 150° C. and the third predetermined time may be 3 min. Those skilled in the art should understand, the third temperature and the third predetermined time may be determined based on the thickness and area of the silicon-wafer sub-plates 701 and the adhesion between the silicon-wafer sub-plates 701 and the substrate 801, and intend to provide enough adhesive force between the silicon-wafer sub-plates 701 and the substrate 801. The above-mentioned values are just illustrative and should not be taken as limit to the scope of the present disclosure.

In conclusion, according to the present disclosure, the island structures may be obtained by etching the silicon-wafer plate via the first masking structures, and the silicon-wafer sub-plates for manufacturing the island elements of the TFT substrate may be obtained by cutting layer by layer the island structures. The acquired silicon-wafer sub-plates may be attached onto the substrate to form the TFT substrate. Therefore, the present disclosure may improve the stability of the substrate during bending and reduce the stress mismatch between the substrate and the film of a TFT component.

Figure 9:
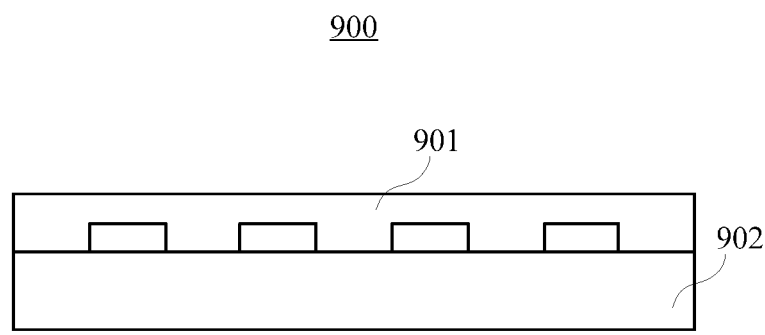
FIG. 9 shows a diagram of the TFT substrate according to an embodiment of the present disclosure.

Referring to FIG. 9, FIG. 9 shows a diagram of the TFT substrate according to an embodiment of the present disclosure.

In this embodiment, the TFT substrate 900 may include a TFT component film 901 and the substrate 902. The TFT substrate 900 may be manufactured by the method described in the above embodiments. Therefore, the stress mismatch during bending between the TFT component film 901 and the substrate 902 of the TFT substrate 900 may be reduced, and the stability of the TFT substrate 900 during bending may be improved.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A method for manufacturing a TFT substrate, comprising:
   providing a silicon-wafer plate;
   forming a plurality of first masking structures on the silicon-wafer plate and etching the silicon-wafer plate via the first masking structures to form island structures;
   cutting the island structures layer by layer to form a silicon-wafer sub-plate; and
   adhering the silicon-wafer sub-plate on a substrate to form the TFT substrate.

2. The method of claim 1, wherein the forming of the first masking structures on the silicon-wafer plate, comprises:
   coating the silicon-wafer plate with a layer of photoresist material;
   removing a portion of the photoresist material where the first masking structures are to be set;
   forming a first masking layer on remaining portions of the photoresist material and on the silicon-wafer plate where the first masking structures are to be set;
   removing portions of the first masking layer with an etching solution corresponding to the photoresist material, so as to form the first masking structures.

3. The method of claim 1 further comprising:
   after forming the island structures, depositing a layer of second masking structures on the silicon-wafer plate and the island structures;
   forming a first protection layer on a portion of the second masking structures of the silicon-wafer plate which are not on the island structures;
   hardening the first protection layer;
   removing other portions of the layer of second masking structures on the island structures with an etching solution of the layer of second masking structures;
   forming on the silicon-wafer plate a second protection layer wrapping around the island structures; and
   hardening the second protection layer.

4. The method of claim 3, wherein the step of hardening the first protection layer comprises:
   placing the first protection layer in a first temperature environment for a first predetermined time to harden the first protection layer;
   the step of hardening the second protection layer comprises:
   placing the second protection layer in a second temperature environment for a second predetermined time to harden the second protection layer.

5. The method of claim 3, wherein the step of the cutting the island structures layer by layer comprises:
   cutting layer by layer the island structures and the second protection layer to obtain a second protection sub-layer, wherein the second protection sub-layer has the silicon-wafer sub-plate wrapped inside.

6. The method of claim 5, wherein a direction for cutting layer by layer the second protection layer wrapping around the island structures is parallel to an extending direction of the silicon-wafer plate.

7. The method of claim 5, further comprising:
   transferring the second protection sub-layer onto the substrate;
   plasma etching the second protection sub-layer to expose the silicon-wafer sub-plate, to form the TFT substrate.

8. The method of claim 5, further comprising:
   placing the TFT substrate in a third temperature environment for a third predetermined time.

9. A method for manufacturing a TFT substrate, comprising:
   providing a silicon-wafer plate;
   forming a plurality of first masking structures on the silicon-wafer plate;
   etching the silicon-wafer plate via the first masking structure to form island structures;
   cutting the island structures into a plurality of silicon-wafer sub-plates;
   adhering one of the silicon-wafer sub-plates onto a substrate to form the TFT substrate.

10. The method of claim 9, wherein the forming of the first masking structures on the silicon-wafer plate comprises:
   coating the silicon-wafer plate with a layer of photoresist material;
   removing a portion of the photoresist material in an first area of the silicon-wafer plate;
   forming a first masking layer on the photoresist material and the first area of the silicon-wafer plate;
   removing the first masking layer on the photoresist material with an etching solution corresponding to the photoresist material to form the first masking structures.

11. The method of claim 9, further comprising:
   forming a main protection layer wrapping around the island structures after forming the island structures on the silicon-wafer plate;
   wherein, the step of cutting the island structures comprises:
   cutting the island structures and the main protection layer into a plurality of sub-layers with the silicon-wafer sub-plates inside.

12. The method of claim 11, wherein the step of adhering one of the silicon-wafer sub-plates onto a substrate comprises:
   adhering one of the sub-layers onto the substrate.

13. The method of claim 11, wherein a direction for cutting the island structures and the main protection layer is parallel to an extending direction of the silicon-wafer plate.

14. The method of claim 11, wherein before forming the main protection layer, the method further comprises:
   depositing a layer of second masking structures on the silicon-wafer plate and the island structures;
   forming a mask-protection layer on a portion of the second masking structures located on the silicon-wafer plate.

15. The method of claim 14, wherein before cutting the island structures and the main protection layer, the method further comprises:
   separating the island structures and the main protection layer from the mask-protection layer.

16. The method of claim 14, further comprising:
   placing the mask-protection layer in a first temperature environment for a first predetermined time, to harden the mask-protection layer; and
   placing the main protection layer in a second temperature environment for a second predetermined time, to harden the main protection layer.

17. The method of claim 16, further comprising:
   placing the TFT substrate in a third temperature environment for a third predetermined time.

* * * * *